Feb. 13, 1973 JIN TWAN LIM 3,716,680
NEGATIVE IMPEDANCE CONVERTERS SUITABLE
FOR BILATERAL GAIN REPEATERS
Filed Sept. 30, 1971

United States Patent Office 3,716,680
Patented Feb. 13, 1973

3,716,680

NEGATIVE IMPEDANCE CONVERTERS SUITABLE FOR BILATERAL GAIN REPEATERS

Jin Twan Lim, Kamata, Ontario, Canada, assignor to Bell Canada-Northern Electric Research Limited, Ottawa, Ontario, Canada Filed Sept. 30, 1971, Ser. No. 185,096
Int. Cl. H04b 3/36, 3/16
U.S. Cl. 179—170 G 10 Claims

ABSTRACT OF THE DISCLOSURE

The realization of novel floating and stable negative impedances utilizing operational amplifiers has been achieved. Stable bilateral gain repeaters in two preferred configurations are thus possible, which utilize only operational amplifiers and resistors.

FIELD OF THE INVENTION

This invention relates to negative impedance converters and particularly to those useful in repeater amplifiers with bilateral gain.

BACKGROUND AND PRIOR ART OF THE INVENTION

Signals on a transmission line have to be regenerated or amplified along the transmission path. This is achieved, at certain intervals along the line, by the use of repeater amplifiers. In some applications a certain class, known as bilateral gain repeaters, are required. Here, the repeater amplifier is required to regenerate the signals on the transmission line regardless of their direction of propagation along the line.

Bilateral gain is often achieved through the utilization of negative resistances in a suitable otherwise passive network. Among the first negative impedance converter circuits employing discreet transistors were those introduced by J. G. Linvill in a paper published June 1953 in the Proceedings of the I.R.E., volume 41, No. 6, pp. 725–729. The trend in modern applications in this field is the use of operational amplifiers as desirable building blocks. However, they have not been quite successful in realizing negative impedance repeaters mainly because of two problems. The first is the difficulty in obtaining a floating or balanced negative resistance between two terminals. And the second is that of instability.

SUMMARY OF THE INVENTION

The present specification discloses circuit configurations negative impedance converters with operational amplifiers realizing a floating or balanced negative impedance, and solving the problem of instability. The disclosed networks are particularly suitable for realizing stable negative resistances, which are therefore, suitable for realizing bilateral repeater amplifiers such as descibed in the preferred embodiments.

According to this invention such an active network comprises two operational amplifiers each with a differential input terminal pair. The output of each of the amplifiers is coupled resistively to both input terminals of the other amplifier. Between the inverting input terminals of the two amplifiers is connected the impedance to be converted.

The above described active network structure may be used to realize a bilateral gain repeater in a bridged-T configuration. In that case, the network is employed as the bridging negative resistance, whereby the impedance to be converted is a conventional positive resistance. This by no means is the only use, and that impedance can be a conventional capacitor, which is then converted to a negative capacitance. Or an inductor to be converted to negative inductance, although this is not a common use of negative impedance converters.

A similar, expanded, active network structure may alternately be used to realize a bilateral gain repeater in a $\pi$ configuration. Previously it has not been possible to construct such a repeater, that is stable (does not oscillate or "sing"). Both the bridged-T and $\pi$ repeaters are described in more detail later on.

BRIEF DESCRIPTION OF THE DRAWINGS

Two example embodiments of the invention will now be described with reference to the accompanying drawings in which.

DESCRIPTION OF THE PREFERRED EMBODIMENTS

Figure 1:
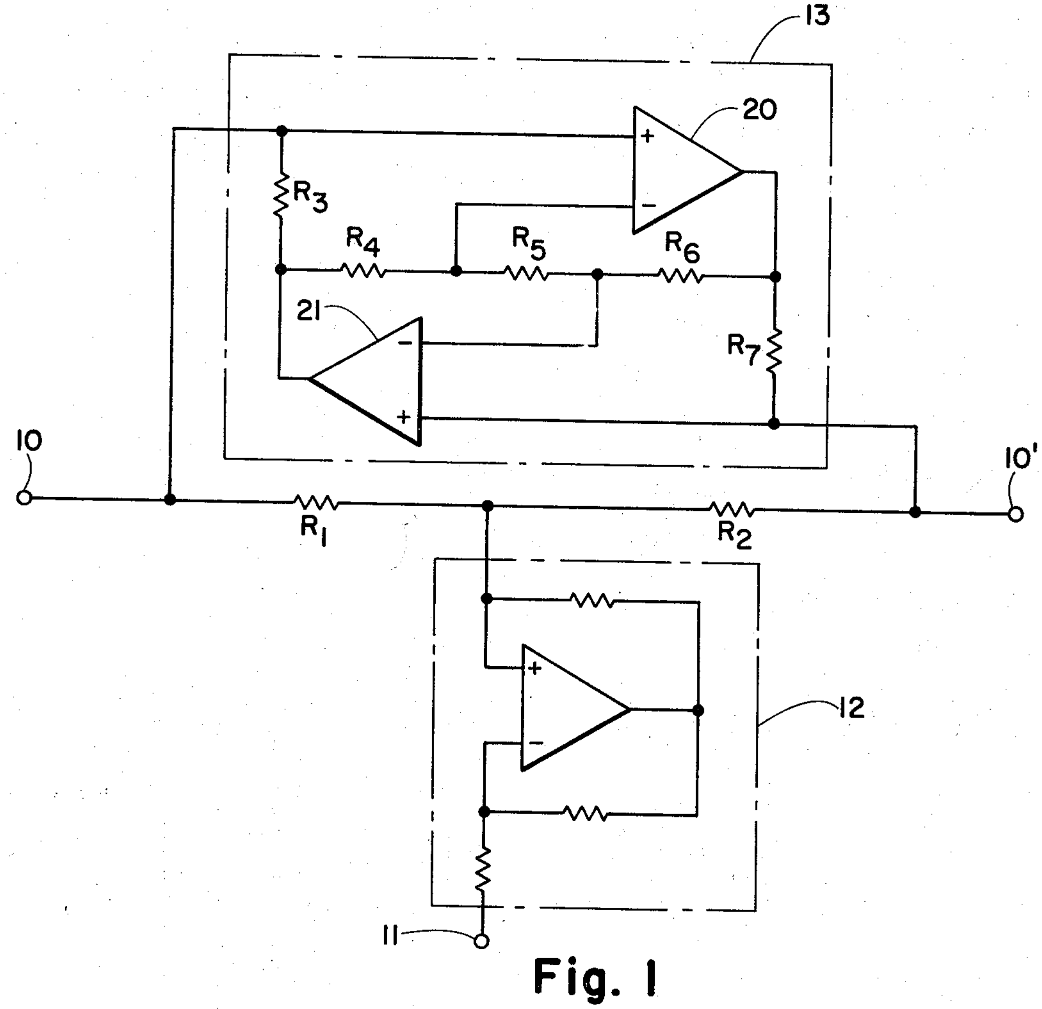
FIG. 1 is a block and circuit schematic of a bilateral gain repeater utilizing a negative resistance according to this invention in a bridge-T configuration.

FIG. 1 depicts a bilateral gain repeater employing a floating negative resistance network 13 according to this invention. The repeater comprises two bilateral terminals 10 and 10', and a common terminal 11. Between the terminals 10 and 10' are connected two conventional resistors $R_1$ and $R_2$. Between the junction of the resistors $R_1$ and $R_2$ and between the common terminal 11, is connected a conventional single ended negative resistance network 12. And between the bilateral terminals 10 and 10' is also connected the floating negative resistance network 13 as the bridging negative resistance of the bridge-T configuration.

The bridging negative resistance realized by the network 13 comprises, first and second operational amplifiers 20 and 21 each having a pair of differential input terminals and an output terminal. The output terminal of each of the operational amplifiers 20 and 21 is coupled to each of the input terminals of the other amplifier via resistors $R_3$, $R_4$, and $R_6$, $R_7$. The inverting input terminals (those denoted by a minus sign in the drawings) of the operational amplifiers 20 and 21 are interconnected via resistance $R_5$, the negative of which, multiplied by a conversion factor, appears between the bilateral terminals 10 and 10'. Terminal 11 is the common terminal of the repeater. It should be noted that the power connections of the operational amplifiers have been omitted for clarity.

While an exact theoretical analysis of the network 13 would be too involved to relate here and has not been rigorously accomplished yet, the invention has been found to function. In the following design rules for the construction of such a repeater, including the network 13, as disclosed here are given, which are deemed sufficient to enable persons skilled in the art to construct the same, although a deeper scientific understanding might be lacking.

It should be noted here, that the resistor $R_5$ can generally be replaced by an impedance. In such a case, the impedance will be converted to its negative, and an inductor to a capacitor, appearing between the bilateral terminals of the network 13. In this preferred embodiment, however, since a negative resistance is desired, the positive real resistor $R_5$ is used.

Assuming that the operational amplifiers 20 and 21 have infinite gain, the network 13 realize a floating negative resistance ($-R$) between the terminals 10 and 10' if the magnitudes of the resistors (denoted by the same symbols) had the following relationships:

$$\frac{R_3}{R_4}=\frac{R_7}{R_6}$$

and $$\frac{R_3R_5}{R_4}=\frac{R_5R_7}{R_6}=R$$

The insertion gain of the repeater, then, is $$\text{Insertion gain db}=20\log_{10}\frac{R_o}{R_o-R}$$

where $R_1=R_2=R_0$, and $R_0$ is the required constant resistance of the repeater between the terminals 10 and 11, and 10' and 11. The resistors $R_1$ and $R_2$ are equal by reason of symmetry. For the same reason, in the network 13 one chooses the resistors $R_3=R_4=R_6=R_7$, but this is not mandatory.

In one realization of the present preferred embodiment, $R_0$ was given as 10,000 ohms, and the insertion gain required was 6 db. Therefore, $$6\ db=20\log_{10}\frac{10,000}{10,000-R}$$

then $$R=\frac{10,000}{2}=5,000\text{ ohms}$$

By choosing $R_3=R_4=R_6=R_7=10{,}000$ ohms, then $$R_5=R=5{,}000$$

ohms. The negative resistance $R^*$ realized by the network 12 should be $$R^*=-\frac{R_o2}{R}=20,000\text{ ohms}$$

$R^*$ can be realized by any other technique and must be short circuit stable; the network 12 is shown here only for the sake of completeness.

Figure 2:
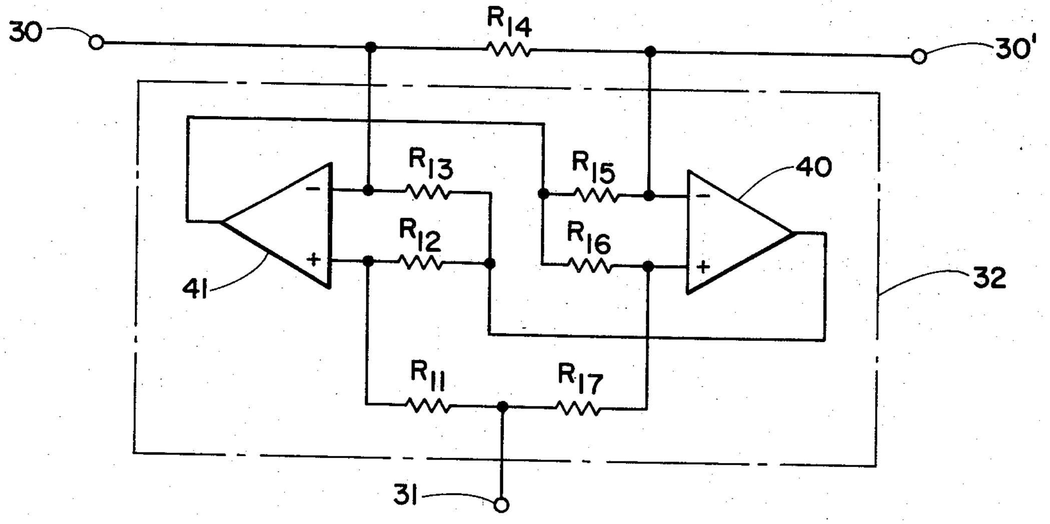
FIG. 2 is a block and circuit schematic of a bilateral gain repeater utilizing a negative resistance according to this inventon in a $\pi$ configuration.

FIG. 2 shows a bilateral repeater having two negative resistances and one positive resistance in a $\pi$ configuration according to the present invention. The repeater having two bilateral terminals 30 and 30' and a common terminal 31, comprises first and second operational amplifiers 40 and 41 each having a pair of differential input terminals and an output terminal. The output terminal of each of the operational amplifiers 40 and 41 is coupled to each of the input terminals of the other amplifier via resistors $R_{12}$, $R_{13}$, and $R_{15}$, $R_{16}$. The inverting input terminals of the operational amplifiers 40 and 41 are interconnected via resistor $R_{14}$. The noninverting input terminals (those denoted by a plus sign in the drawings) of the operational amplifiers 40 and 41 are interconnected via resistors $R_{11}$ and $R_{17}$ in series, whereby a common terminal 31 of the repeater is the junction of the resistors $R_{11}$ and $R_{17}$. And the inverting input terminals of the operational amplifiers 40 and 41 being the bilateral terminals 30 and 30'.

The constant resistance of the repeater, i.e. that appearing between the terminal pairs 30 and 31, and 30' and 31 when properly terminated, is $R_0$, which is a given parameter. The two negative resistances are shunted between the terminals 30 and 31, and 30' and 31, and are termed $(-R)$ and $(-R')$ respectively. The magnitudes of them, $R$ and $R'$, are usually equal. The required voltage gain ratio $G$ of the repeater is related to $R_{14}$, $R$ and $R_0$ by $$R_{14}=\frac{R_o}{2}\left(G-\frac{1}{G}\right)$$

and $$R=R_1\frac{G-1}{G+1}$$

The magnitude of the negative resistance $R$ is related to the values of the resistors $R_{11}$, $R_{12}$, $R_{13}$, $R_{15}$, $R_{16}$, and $R_{17}$ by $$R=\frac{R_{11}R_{13}}{R_{12}}=\frac{R_{15}R_{17}}{R_{16}}$$

Again with a given $R_0$ of 10,000 ohms and $G=2$, then $$R_{14}=\frac{10,000}{2}(2\tfrac{1}{2})=7,500\text{ ohms}$$

and $$R=10{,}000\times\tfrac{1}{3}=3300\text{ ohms}$$

By choosing $R_{11}=R_{12}=R_{16}=R_{17}=10{,}000$ ohms, then $$R_{13}=R_{15}=R=3300\text{ ohms}$$

The network is thus wholly determined.

All the above formulas assume ideal operational amplifiers with infinite gain. In reality some variation from the calculated gain and constant resistance is the result, just as is the case in most applications using real components. The other characteristics of the actual circuits, such as signal handling capabilities, frequency response and so forth are mainly limited by the characteristics of the operational amplifiers. And the performance is, therefore, limited to an extent by the state of the art of such amplifiers.

What is claimed is:

1. An active network having a pair of bilateral terminals comprising:

(a) first and second operational amplifiers each having first and second differential input terminals and an output terminal;

(b) the output terminal of each of said first and second operational amplifiers being directly coupled via resistive circuit means to the first and second input terminals of the other operational amplifier;

(c) the first input terminals being interconnected via impedance circuit means; and (d) the second input terminals being said pair of bilateral terminals.

2. An active network as defined in claim 1 wherein said first input terminals are the inverting input terminals of said operational amplifiers.

3. An active network as defined in claim 1 wherein said second input terminals are the inverting input terminals of said operational amplifiers.

4. An active network as defined in claim 1 wherein: the output terminal of said first operational amplifier is coupled via a first pair of resistors one to each of said first and second input terminals of said second operational amplifier, and the output terminal of said second operational amplifier is coupled via a second pair of resistors one to each of said first and second input terminals of said first operational amplifier.

5. An active network as defined in claim 2 wherein: the output terminal of said first operational amplifier is coupled via a first pair of resistors one to each of said first and second input terminals of said second operational amplifier, and the output terminal of said second operational amplifier is coupled via a second pair of resistors one to each of said first and second input terminals of said first operational amplifier.

6. An active network as defined in claim 3 wherein: the output terminal of said first operational amplifier is coupled via a first pair of resistors one to each of said first and second input terminals of said second operational amplifier, and the output terminal of said second operational amplifier is coupled via a second pair of resistors one to each of said first and second input terminals of said first operational amplifier.

7. An active bilateral repeater network having a pair of bilateral terminals, and a common terminal, comprising:

(a) first and second operational amplifiers each having first inverting and second noninverting differential input terminals and an output terminal;

(b) the output terminal of each of said first and second operational amplifiers being directly coupled via resistive circuit means to the first and second input terminals of the other operational amplifier;

(c) the first input terminals being interconnected via resistive circuit means; and (d) the second input terminals being said pair of bilateral terminals;

(e) two resistive circuit means in series interconnecting said pair of bilateral terminals and having a junction; and (f) a stable negative resistance connected between said junction and said common terminal.

8. An active bilateral repeater network having a pair of bilateral terminals and a common terminal, comprising:

(a) first and second operational amplifiers each having first noninverting and second inverting differential input terminals and an output terminal, (b) the output terminal of each of said first and second operational amplifiers being directly coupled via resistive circuit means to the first and second input terminals of the other operational amplifier, (c) the first input terminals being interconnected via first resistive circuit means, and the second input terminals being interconnected via second resistive circuit means, and (d) the second input terminals, being said pair of bilateral terminals and the first resistive circuit means includes said common terminal.

9. An active bilateral repeater network as defined in claim 7 wherein:

the output terminal of said first operational amplifier is coupled via a first pair of resistors one to each of said first and second input terminals of said second operational amplifier, and the output terminal of said second operational amplifier is coupled via a second pair of resistors one to each of the said first and second input terminal of said first operational amplifier.

10. An active bilateral repeater network as defined in claim 8 wherein:

the output terminal of said first operational amplifier is coupled via a first pair of resistors one to each of said first and second input terminals of said second operational amplifier, and the output terminal of said second operational amplifier is coupled via a second pair of resistors one to each of said first and second input terminals of said first operational amplifier; and said first resistive circuit means being two resistors in series, the junction of which being said common terminal.

References Cited

UNITED STATES PATENTS 3,501,716 3/1970 Ferch et al. ........ 333—80 R

KATHLEEN H. CLAFFY, Primary Examiner

A. FABER, Assistant Examiner